United States Patent [19]

Ophoff

[11] Patent Number: 4,617,551

[45] Date of Patent: Oct. 14, 1986

[54] DIGITAL-TO-ANALOG CONVERTER WITH POTENTIAL SEPARATION

[75] Inventor: Paul A. Ophoff, Worth, Fed. Rep. of Germany

[73] Assignee: Siemens Aktiengesellschaft, Munich, Fed. Rep. of Germany

[21] Appl. No.: 535,073

[22] Filed: Sep. 23, 1983

[30] Foreign Application Priority Data

Sep. 27, 1982 [DE] Fed. Rep. of Germany ....... 3235741

[51] Int. Cl.[4] ............................................. H03K 13/02
[52] U.S. Cl. ............................................. 340/347 DA
[58] Field of Search ................ 340/347 DA, 347 AD; 250/551; 377/39

[56] References Cited

U.S. PATENT DOCUMENTS

| | | | |
|---|---|---|---|
| 3,422,423 | 1/1969 | Kaszynski et al. | 340/347 DA |
| 3,588,880 | 6/1971 | Gross et al. | 340/347 DA |
| 4,390,796 | 6/1983 | McClenahan et al. | 340/347 AD |

Primary Examiner—Clifford C. Shaw
Attorney, Agent, or Firm—Kenyon & Kenyon

[57] ABSTRACT

A digital-to-analog converter includes an interim memory, with parallel storage locations for N bits connected to a digital data channel, followed by a full adder to the input of which the output of a free-running counter with N bits is also connected. The carry output of the full adder is connected, via an optical coupler, acting as a potential separator, to a mean value former which forms from the pulse sequence which occurs at the carry output of the full adder, and the duty cycle of which corresponds to the digital value stored in the interim memory, a mean analog value which is provided as the final output. Even in multichannel designs, only one optical coupler is required for the data transmission, on the switching properties of which the linearity and stability depend in substance.

2 Claims, 2 Drawing Figures

DIGITAL-TO-ANALOG CONVERTER WITH POTENTIAL SEPARATION

BACKGROUND OF THE INVENTION

This invention relates to a digital-to-analog converters in general and more particularly to a digital-to-analog converter with potential separation.

In known designs for the parallel conversion of digital value of N bits into an analog value, a number N corresponding to the number of bits, of potential separation devices, preferably optical couplers, is required. The couplers act in parallel providing inputs to one of the customary types of digital-to-analog converter, for instance, a converter with an R/2 R resistance network.

In the known digital-to-analog converters, linearity errors occur. If steps are taken to increase the resolution, disproportionally high costs result.

The problem therefore arises to provide a digital-to-analog converter of simple design, in which the errors of the digital-to-analog converters of the conventional type are largely eliminated.

SUMMARY OF THE INVENTION

A solution of this problem is achieved, according to the present invention, by a digital-to-analog converter with potential separation through the use of a known indirect digital-to-analog converter with a pulse length modulated intermediate signal and a mean value forming analog output with a potential separating optical coupler inserted into the conduction path of the intermediate signal.

Only a single optical coupler, rath than N such couplers, is still required for transmitting a digital value of N bits. The mean value former can preferably be an inexpensive circuit which is constructed from R-C networks and an operational amplifier. Such circuits which form the mean value of a periodic input quantity are well known in the art.

According to the same principle, digital-to-analog converters can also be constructed in a multichannel design in an inexpensive manner through the use of:
(a) M interim memories with Tri-state or open collector outputs, each having parallel storage locations for N bits;
(b) a free-running counter with at least an N+1 bit output;
(c) an N bit full adder with a carry output, to the input of which the outputs from the memories and counter are connected;
(d) a first optical coupler at the carry output of the full adder; and
(e) a second optical coupler at the (N+1)th output, of the counter.

BRIEF DESCRIPTIONS OF THE DRAWINGS

DETAILED DESCRIPTION

Figure 1:
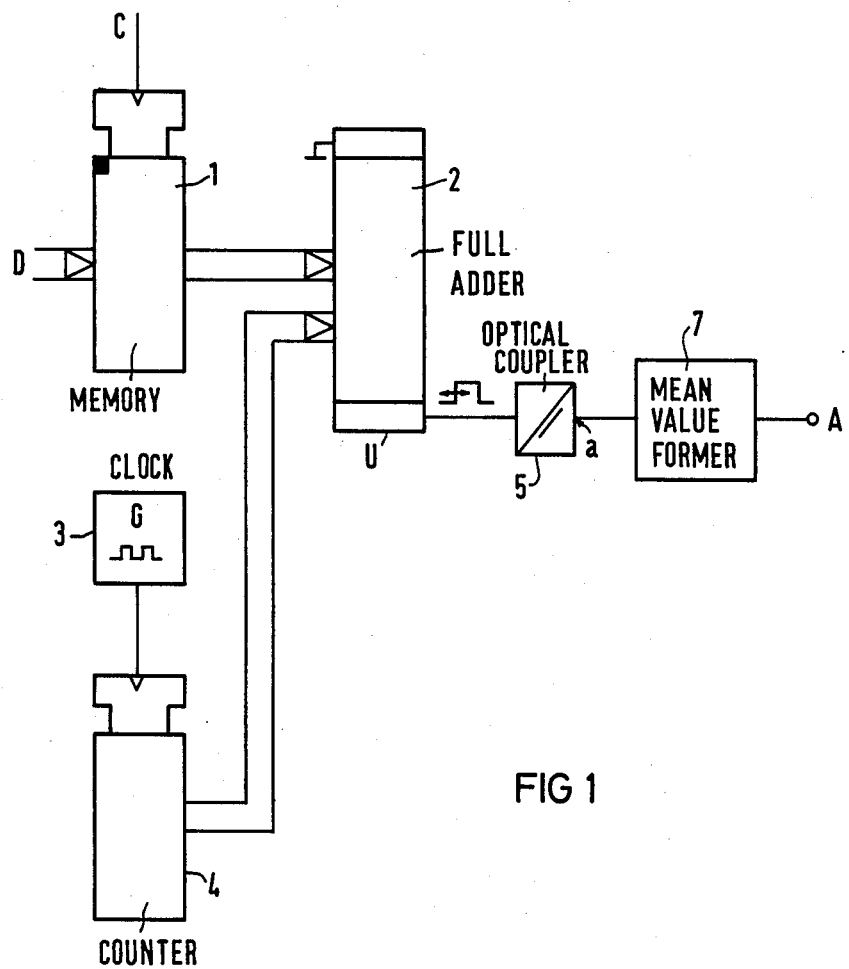
FIG. 1 illustrates a single channel converter according to the present invention.

As illustrated by FIG. 1, a digital value of N bits (N=8, 10 or 12) on a data channel D is fed to an interim memory 1 with N parallel storage locations. The input to the interim memory 1 is enabled, in conventional fashion, via a trigger input C.

The interim memory 1 is followed by a full adder 2 with a carry output U, to the data input of which is connected, in addition to the output of interim memory 1, the output of a free-running N bit counter 4 which is fed with pulses from a clock generator 3.

A pulse length modulated pulse sequence, the duty cycle of which corresponds exactly to the digital value read into the interim memory 1 will appear at the carry output U of the full adder 2.

The periodic output signal at the carry output U of the full adder 2 is fed to a potential separating device in the form of an optical coupler 5, the output signal a of which is fed to a mean value former 7, at the output of which an analog output signal A corresponding to the digital input value is present.

Figure 2:
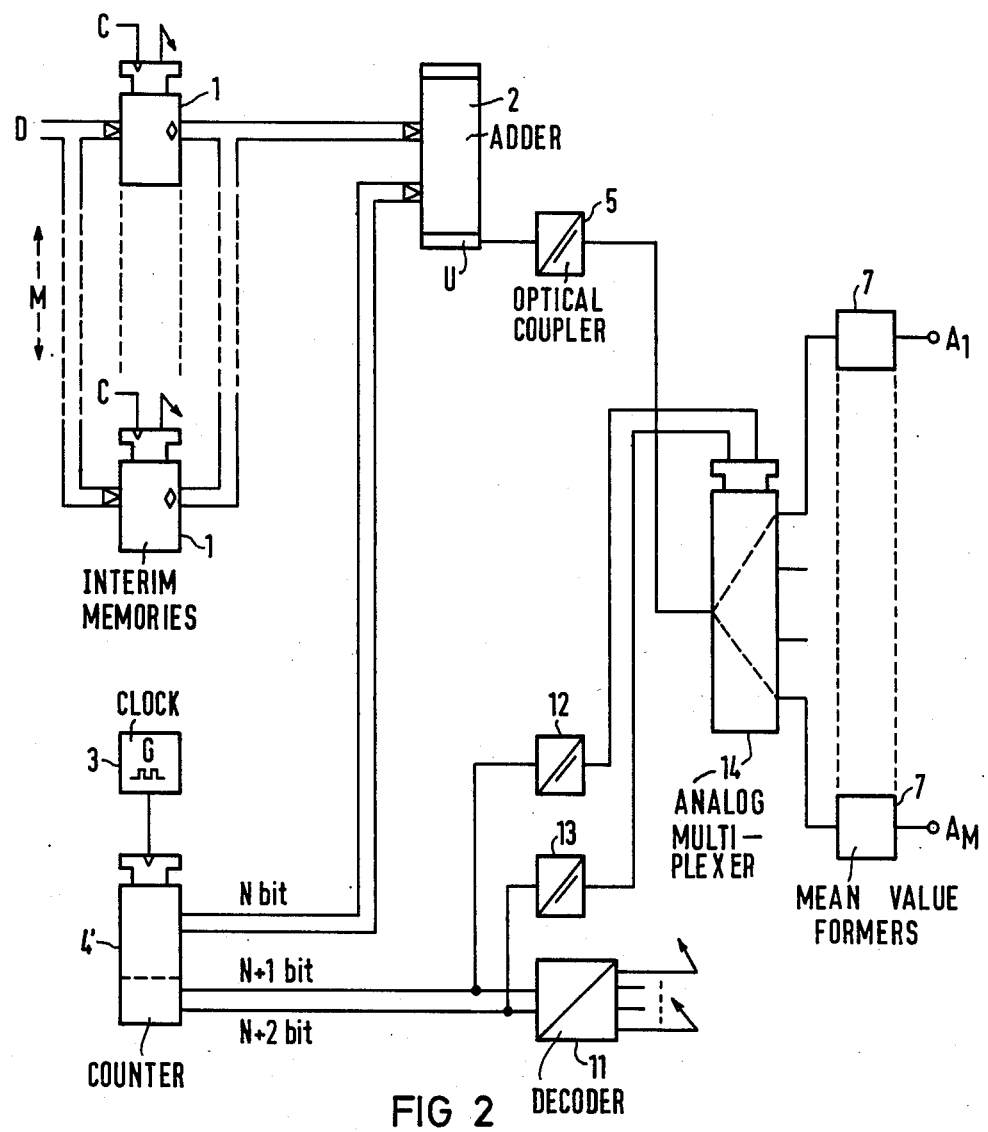
FIG. 2 illustrates a multichannel design of a converter according to the present invention.

In FIG. 2 a multichannel design is shown which operates according the same principle as the single-channel design shown in FIG. 1. Similar parts are marked with the same reference symbols.

M data channels D are provided, M being, for instance, 2, 3 or 4. They lead into M memories 1 each with parallel storage locations for N bits. The interim memories have a tri-state or open collector output. The inputs of the individual interim memories 1 are again enabled via their control inputs C.

A full adder 2 for N bits, with a carry output U, is connected to the M interim memories, and receives as a second input, as in FIG. 1 the output of a counter 4' driven by a free-running clock generator 3.

The counter 4' has N+1 and N+2 bit outputs respectively. The outputs for the (N+1)th bit in the case of two channels or the (N+1)th and (N+2)th bit in the case of three or four channels are connected to a decoder 11, with M outputs for selecting the corresponding interim memories 1 via their inputs C. The decoder 11 is operated at a frequency of, for instance, $2^N \times 100$ Hz. The two extra bits will handle four channels. Three extra bits (N+1, N+2 and N+3) will permit 8 channels to be converted. Alternatively, the counter can be a divide by P counter where $P=2^N+M-1$. In each case the first N bit outputs are coupled into the full adder. To the (N+1)th and N+2)th outputs of the counter 4' are connected, in parallel with the decoder 11, optical couplers 12 and 13, respectively, the outputs of which are connected to the control inputs of an analog multiplexer 14. If only two channels are provided, of course only the optical coupler 12 is needed. The data signal input of the analog multiplexer 14 is connected to the optical coupler 5 and received therefrom the pulse sequence from the full adder 2, the duty cycle of which corresponds to the digital value of the selected interim memory 1.

The M outputs of the analog multiplexer 14 are coupled in sequence to a corresponding number of mean value formers, at the outputs of which the analog values $A_1 \ldots A_M$ are present.

What is claimed is:
1. A digital-to-analog converter for converting data on a parallel digital channel comprising:
   (a) an interim memory with parallel storage locations for N bits having its inputs connected to the digital data channel;
   (b) a free-running N bit counter having N bit outputs;
   (c) an N bit full adder with a carry output, having as inputs the outputs of said memory and the outputs of said counter;
   (d) an optical coupler having it input coupled to the carry output of said full adder; and

(e) an electronic mean value former having its input connected to the output of said optical coupler, and providing an output which is an analog output signal corresponding to the digital input value present at said memory.

2. A digital-to-analog converter for converting digital data on M data channels, comprising:

(a) M interim memories with tri-state or open collector outputs each having parallel storage locations for N bits;

(b) a free-running counter with at least N+1 bit outputs;

(c) an N-bit full adder with a carry output, having as inputs the outputs of said memories and the first N bit outputs of said counter;

(d) a first optical coupler having its input coupled to the carry output of said full adder;

(e) a second optical coupler having as an input the (N+1)th bit output of said counter;

(f) an analog multiplexer having as a data signal input the output of said first optical coupler and as a control input the output of said second optical coupler;

(g) a plurality of M mean value formers coupled to the outputs of said multiplexer; and (h) a decoder having as an input the output of said second optical coupler and providing enable inputs to said memories.

* * * * *